(12) United States Patent
Cai et al.

(10) Patent No.: US 8,691,696 B2
(45) Date of Patent: Apr. 8, 2014

(54) METHODS FOR FORMING AN INTEGRATED CIRCUIT WITH STRAIGHTENED RECESS PROFILE

(75) Inventors: Xiuyu Cai, Albany, NY (US); Xunyuan Zhang, Albany, NY (US); Ruilong Xie, Albany, NY (US); Errol T. Ryan, Clifton Park, NY (US); John Iacoponi, Wappingers Falls, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 120 days.

(21) Appl. No.: 13/476,860

(22) Filed: May 21, 2012

(65) Prior Publication Data

US 2013/0309868 A1  Nov. 21, 2013

(51) Int. Cl.
*H01L 21/311* (2006.01)

(52) U.S. Cl.
USPC ............ 438/694; 438/947; 257/211; 257/775

(58) Field of Classification Search
None
See application file for complete search history.

(56) References Cited

U.S. PATENT DOCUMENTS

| | | | |
|---|---|---|---|
| 5,328,810 A | | 7/1994 | Lowrey et al. |
| 6,345,399 B1 * | | 2/2002 | Jamison et al. ............... 438/702 |
| 7,268,054 B2 | | 9/2007 | Tran et al. |
| 7,629,693 B2 * | | 12/2009 | Abatchev et al. ............. 257/775 |
| 8,268,727 B2 * | | 9/2012 | Johnson et al. ............... 438/692 |
| 2001/0005615 A1 * | | 6/2001 | Lee et al. ....................... 438/296 |
| 2009/0246961 A1 * | | 10/2009 | Heo .............................. 438/706 |
| 2010/0267238 A1 | | 10/2010 | Johnson et al. |
| 2010/0308381 A1 * | | 12/2010 | Luning et al. ................. 257/288 |

OTHER PUBLICATIONS

U.S. Office Action issued Aug. 17, 2011 in U.S. Appl. No. 12/426,827.
U.S. Office Action issued Feb. 2, 2012 in U.S. Appl. No. 12/426,827.
Advisory Action issued May 7, 2012 in U.S. Appl. No. 12/426,827.

* cited by examiner

*Primary Examiner* — Binh X Tran
*Assistant Examiner* — David Cathey, Jr.
(74) *Attorney, Agent, or Firm* — Ingrassia Fisher & Lorenz, P.C.

(57) ABSTRACT

Methods are provided for forming an integrated circuit. In an embodiment, the method includes forming a sacrificial mandrel overlying a base substrate. Sidewall spacers are formed adjacent sidewalls of the sacrificial mandrel. The sidewall spacers have a lower portion that is proximal to the base substrate, and the lower portion has a substantially perpendicular outer surface relative to the base substrate. The sidewall spacers also have an upper portion that is spaced from the base substrate. The upper portion has a sloped outer surface. A first dielectric layer is formed overlying the base substrate and is conformal to at least a portion of the upper portion of the sidewall spacers. The upper portion of the sidewall spacers is removed after forming the first dielectric layer to form a recess having a re-entrant profile in the first dielectric layer. The re-entrant profile of the recess is straightened.

18 Claims, 6 Drawing Sheets

METHODS FOR FORMING AN INTEGRATED CIRCUIT WITH STRAIGHTENED RECESS PROFILE

TECHNICAL FIELD

The present invention generally relates to methods of forming an integrated circuit and more particularly relates to recess formation in a dielectric layer overlying a semiconductor substrate during formation of integrated circuits.

BACKGROUND

Integrated circuits find wide-ranging use for applications such as microprocessors, microcontrollers, and application-specific integrated circuits. One category of integrated circuits include metal oxide semiconductor (MOS) transistors. MOS transistors generally include a gate electrode formed over the semiconductor wafer, with the gate electrode being insulated from the semiconductor wafer by a thin layer of gate insulator material. A source and a drain are spaced apart regions of either N-type or P-type semiconductor material and are generally embedded within the semiconductor wafer adjacent to the gate electrode on either side thereof. A region in the semiconductor wafer between the source and the drain, and beneath the gate electrode, forms a channel of the MOS transistor.

Traditionally, the gate electrode is formed from a semiconductor material such as polysilicon. However, due to polysilicon depletion and threshold voltage shifts attributable to boron penetration into the channel region that severely degrade device performance, the semiconductor industry began investigating metal gate electrodes as a replacement for polysilicon gate electrodes. Replacement of polysilicon with a metal gate electrode solves both the boron penetration and the polysilicon depletion issues.

One challenge to the replacement of polysilicon gate electrodes with metal gate electrodes is process integration into conventional transistor processing. Many candidate metals for the metal gate electrodes will not sustain high temperatures associated with a standard source/drain activation anneal due to either unwanted reactions involving the metals at the high temperatures or due to low melting temperatures of many candidate metals.

One proposed technique for forming metal gate electrodes includes forming a sacrificial mandrel followed by subsequent removal of the sacrificial mandrel and metal filling to form the metal gate electrodes, also known in the art as replacement metal gate (RMG) fabrication. In RMG fabrication, the sacrificial mandrel is formed over a sacrificial dielectric layer on a semiconductor substrate over the sacrificial dielectric layer, followed by optional ion implantation into source/drain regions in the semiconductor substrate. Sidewall spacers are then formed adjacent sidewalls of the sacrificial mandrels. The sidewall spacers are formed by an anisotropic etch of a blanket-coated, generally dielectric, layer overlying the mandrel. Because sidewall spacers are formed by an anisotropic etch along the sidewall of a substantially straight-walled sacrificial mandrel, the sidewall spacers typically have a lower portion that is proximal to the base substrate and that has a substantially perpendicular outer surface relative to the base substrate and an upper portion that is spaced from the base substrate and that has a sloped outer surface. Following formation of the sidewall spacers, a dielectric layer is formed over the base substrate with the dielectric layer abutting at least a portion of the sloped outer surface of the sidewall spacers. The upper portion of the sidewall spacers, along with an adjacent portion of the sacrificial mandrels, is selectively removed, thereby leaving the lower portion of the sidewall spacers in place. The remaining portions of the sacrificial mandrel are selectively etched, leaving the lower portion of the sidewall spacers in place. The lower portion of the sidewall spacers are employed as an etch mask to etch through the sacrificial dielectric layer, followed by filling the recess with a gate insulator to form a gate dielectric layer and metal to form the replacement metal gate electrode. The main advantage of using the RMG technique outlined above is that it avoids thermal and plasma damage to the gate dielectric layer and the metal gate electrode that may otherwise occur if the metal gate electrode is present earlier in device fabrication.

One problem with the aforementioned RMG techniques, or any fabrication technique that involves recess formation in the manner described above followed by filling of the recess, is that removal of the upper portion of the sidewall spacers and adjacent sacrificial mandrel results in a re-entrant profile of the resulting recess that is defined in the gate dielectric layer. Due to the re-entrant profile of the recess, filling the recess with electrically-conductive material is challenging and often results in unsatisfactory filling of the recess.

Accordingly, it is desirable to provide methods of forming integrated circuits in which recesses are formed in a dielectric layer using a sacrificial mandrel and sidewall spacers adjacent to sidewalls thereof while alleviating the re-entrant profile of the recesses. Further, other desirable features and characteristics of the present invention will become apparent from the subsequent detailed description of the invention and the appended claims, taken in conjunction with the accompanying drawings and this background of the invention.

BRIEF SUMMARY

Methods are provided for forming integrated circuits. In an embodiment, the method includes forming a sacrificial mandrel overlying a base substrate. The sacrificial mandrel has sidewalls. Sidewall spacers are formed adjacent the sidewalls of the sacrificial mandrel. The sidewall spacers have a lower portion that is proximal to the base substrate, and the lower portion has a substantially perpendicular outer surface relative to the base substrate. The sidewall spacers also have an upper portion that is spaced from the base substrate. The upper portion has a sloped outer surface. A first dielectric layer is formed overlying the base substrate and conformal to at least a portion of the upper portion of the sidewall spacers. The upper portion of the sidewall spacers is removed after forming the first dielectric layer to form a recess in the first dielectric layer. The recess has a re-entrant profile corresponding to the sloped outer surface of the upper portion of the sidewall spacers. The re-entrant profile of the recess is straightened.

In another embodiment, the method includes forming a sacrificial mandrel overlying a base substrate. The sacrificial mandrel has sidewalls. Sidewall spacers are formed adjacent the sidewalls of the sacrificial mandrel. The sidewall spacers have a lower portion that is proximal to the base substrate, and the lower portion has a substantially perpendicular outer surface relative to the base substrate. The sidewall spacers also have an upper portion that is spaced from the base substrate. The upper portion has a sloped outer surface. A first dielectric layer is formed overlying the base substrate and conformal to at least a portion of the upper portion of the sidewall spacers. The upper portion of the sidewall spacers is removed after forming the first dielectric layer to form a recess in the first dielectric layer. The recess has a re-entrant profile corresponding to the sloped outer surface of the upper portion of the sidewall spacers. The first dielectric layer has a free region that is spaced from the lower portion of the sidewall spacers and a pinned region that is adjacent the lower portion of the sidewall spacers. Compressive stress is generated in the first dielectric layer after removing the upper portion to straighten the re-entrant profile of the recess.

In another embodiment, the method includes forming a sacrificial mandrel overlying a base substrate. The sacrificial mandrel has sidewalls. Sidewall spacers are formed adjacent the sidewalls of the sacrificial mandrel. The sidewall spacers have a lower portion that is proximal to the base substrate, and the lower portion has a substantially perpendicular outer surface relative to the base substrate. The sidewall spacers also have an upper portion that is spaced from the base substrate. The upper portion has a sloped outer surface. A stress generation layer is formed overlying the base substrate and in compressive stress. A first dielectric layer is formed overlying the stress generation layer and the base substrate. The first dielectric layer is conformal to at least a portion of the upper portion of the sidewall spacers. The upper portion of the sidewall spacers is removed after forming the first dielectric layer to form a recess in the first dielectric layer. The recess has a re-entrant profile corresponding to the sloped outer surface of the upper portion of the sidewall spacers. The first dielectric layer has a free region spaced from the lower portion of the sidewall spacers and a pinned region adjacent the lower portion of the sidewall spacers. Tensive stress is generated in the first dielectric layer concurrent with removing the upper portion of the sidewall spacers to straighten the re-entrant profile of the recess.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
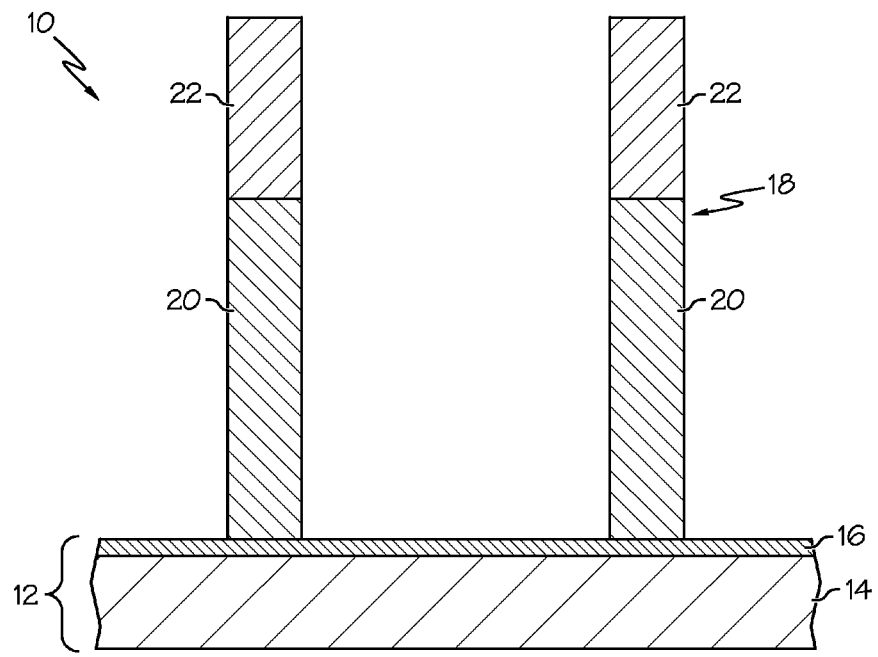
FIG. 1 is a schematic cross-sectional side view of sacrificial mandrels formed on a base substrate.

The following detailed description is merely exemplary in nature and is not intended to limit the invention or the application and uses of the invention. Furthermore, there is no intention to be bound by any theory presented in the preceding background or the following detailed description.

Methods of forming integrated circuits are provided herein in which sacrificial mandrels and sidewall spacers adjacent to sidewalls of the sacrificial mandrels are used to form recesses within a first dielectric layer or other dielectric layer of an integrated circuit, which overlies a base substrate. The sidewall spacers have a lower portion that has a substantially perpendicular outer surface relative to the base substrate and an upper portion that is spaced from the base substrate and that has a sloped outer surface. Removal of the upper portion of the sidewall spacers forms a recess having a re-entrant profile corresponding to the sloped outer surface of the upper portion of the sidewall spacers. As referred to herein, the re-entrant profile refers to an inverted shape having a lesser cross-sectional area at an opening of the recess than a cross-sectional area at deeper portions of the recess. In accordance with the methods described herein, the re-entrant profile of the recess is straightened to effectively open the recess and avoid difficulties with subsequent processing that are associated with the re-entrant profile of the recess. By straightening the re-entrant profile, it is meant that first dielectric layer that defines the re-entrant profile is manipulated, such as through stress generation within the first dielectric layer or through transfer of stress to the first dielectric layer, to decrease a difference between cross-sectional area at the opening of the recess and cross-sectional area at deeper portions of the recess without removing portions of the first dielectric layer that define the re-entrant profile of the recess. Stress can be generated in the first dielectric layer in various ways as described in further detail below.

An exemplary embodiment of a method of forming an integrated circuit 10 will now be addressed with reference to FIGS. 1-7 in which only a portion of the IC is illustrated. To form integrated circuit 10, a base substrate 12 is first provided and generally includes a semiconductor layer 14. Suitable semiconductor layers can include silicon, germanium, a III-V material such as gallium arsenide, or other semiconductor material. In an embodiment, the base substrate 12 includes a sacrificial dielectric layer 16 directly overlying the semiconductor layer 14. The sacrificial dielectric layer 16 may include an oxide such as silicon dioxide. The base substrate 12 may also include one or more additional layers (not shown) other than those described above, such as an insulating layer, additional semiconductor layer, or the like.

A sacrificial mandrel 18 is formed overlying the base substrate 12. In an embodiment, the sacrificial mandrel 18 is formed directly on the sacrificial dielectric layer 16 of the base substrate 12. The sacrificial mandrel 18 is formed in locations over the base substrate 12 where a recess 32 is to be formed in subsequent layers as described in further detail below. The sacrificial mandrels 18 may be employed to form recesses 32 in accordance with a replacement metal gate (RMG) technique or a self-aligned contact (SAC) technique, depending upon a particular level within the integrated circuit 10 in which the recess 32 is to be formed. It is to be appreciated that a plurality of sacrificial mandrels 18 may be formed overlying the base substrate 12.

The sacrificial mandrel 18 includes a first region 20 that is proximal to the base substrate 12 and that includes a first sacrificial material, and further includes a second region 22 that is spaced from the base substrate 12 and that includes a second sacrificial material. The first sacrificial material and the second sacrificial material may include a deposited silicon oxide, silicon nitride, silicon oxynitride, polycrystalline silicon, amorphous silicon, amorphous carbon (a-C), a carbon-doped silica (SiCOH), or another material suitable for providing mechanical support for sidewall spacers 24 to be formed in a manner described in detail below. The first sacrificial material and the second sacrificial material are different to enable selective etching of the second region 22 without etching the first region 20. The sacrificial mandrel 18 having the first region 20 and the second region 22 may be formed through conventional techniques. For example, deposition techniques such as plasma enhanced chemical vapor deposition (PECVD), low pressure chemical vapor deposition (LPCVD), or chemical vapor deposition (CVD) processes can be employed to form a first mandrel layer (not shown) that provides the first region 20 of the sacrificial mandrel 18, followed by use of the aforementioned deposition techniques to form a second mandrel layer (not shown) that provides the second region 22 of the sacrificial mandrel 18. A suitable patterning technique, such as reactive ion etching (RIE), is then employed to form the sacrificial mandrel 18 through the first mandrel layer and the second mandrel layer. In an embodiment, the first sacrificial material of the first region 20 includes silicon, a-C, or SiCOH. The second sacrificial material of the second region 22 has a composition that is different from that of the first region 20. As will be described in greater detail below, the second region 22 is removed along with an upper portion 28 of subsequently formed sidewall spacers 24. In an embodiment, the second sacrificial material may be the same material as the sidewall spacers 24, or may be a material that has a removal rate that is substantially the same as a removal rate of the sidewall spacers 24. In one specific embodiment, the second sacrificial material is silicon nitride. The resulting sacrificial mandrel 18 has sidewalls that have a generally straight profile and that extend substantially perpendicular to the base substrate 12, i.e., the sidewalls are intended to be perpendicular to the base substrate 12, but slight variation from a perpendicular angle is permissible due to practical limitations attributable to the patterning technique employed.

Figure 2:
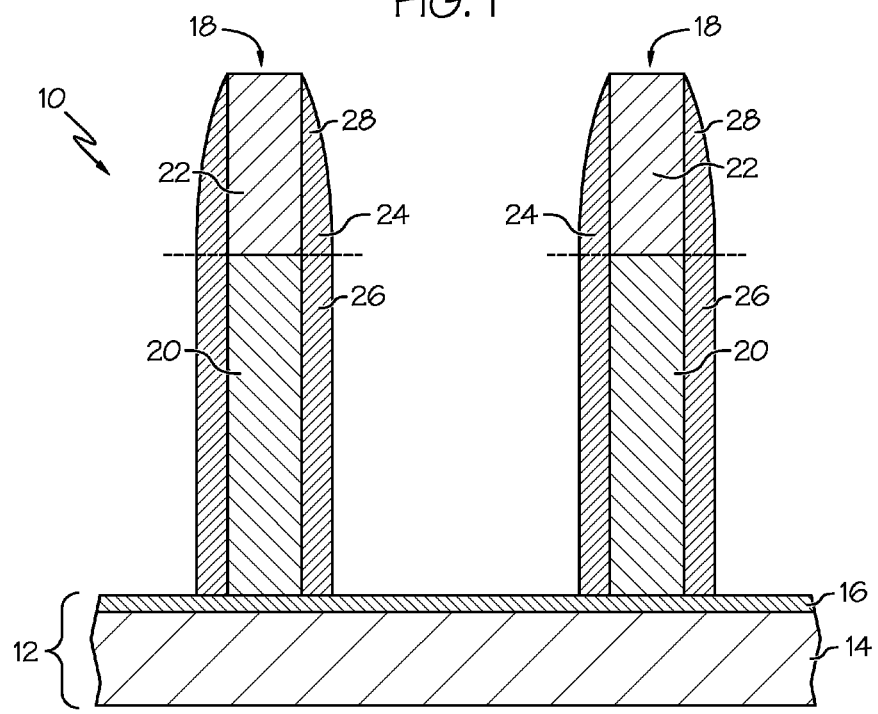
FIG. 2 is a schematic cross-sectional side view of sidewall spacers formed on sidewalls of the sacrificial mandrels of FIG. 1.

Next, as shown in FIG. 2, sidewall spacers 24 are formed adjacent the sidewalls of the sacrificial mandrel 18, and the sidewall spacers 24 can be formed through conventional techniques. In an embodiment, a dielectric material such as, for example, a silicon nitride or a silicon oxide, is blanket-deposited overlying the base substrate 12 and the sacrificial mandrel 18, using the deposition techniques described above for forming the sacrificial mandrel 18, to form a spacer layer (not shown). The spacer layer is then anisotropically etched to form the sidewall spacers 24 adjacent to the sidewalls of sacrificial mandrels 18. Depending upon the type of materials used for the sacrificial mandrel 18 and the sidewall spacers 24, an appropriate etching technique can be employed to anisotropically etch the spacer layer. For example, anisotropic etching may be performed by, for example, plasma etching or RIE using chemistries based upon carbon trifluoride/oxygen ($CHF_3/O_2$) to etch silicon nitride, and $CHF_3$ or carbon tetrafluoride ($CF_4$) to etch silicon oxide or oxynitride.

Due to anisotropic etching that is employed to form the sidewall spacers 24, the sidewall spacers 24 have a lower portion 26 that is proximal to the base substrate 12 and that has a substantially perpendicular outer surface relative to the base substrate 12. Also due to anisotropic etching, the sidewall spacers 24 also have an upper portion 28 that is spaced from the base substrate 12 and that has a sloped outer surface, as shown in FIG. 2. In particular, the upper portion 28 has a variable width due to the sloped outer surface of the upper portion 28. The sloped outer surface is typically rounded and slopes toward the sacrificial mandrel 18. For purposes herein, the lower portion 26 and the upper portion 28 are distinguishable based upon the portions of the sacrificial mandrel 18 over which the lower portion 26 and the upper portion 28 lay, with the lower portion 26 overlying the first region 20 of the sacrificial mandrel 18 and the upper portion 28 overlying the second region 22 of the sacrificial mandrel 18. Thus, the second region 22 of the sacrificial mandrel 18 is adjacent to the upper portion 28 of the sidewall spacers 24.

Figure 3:
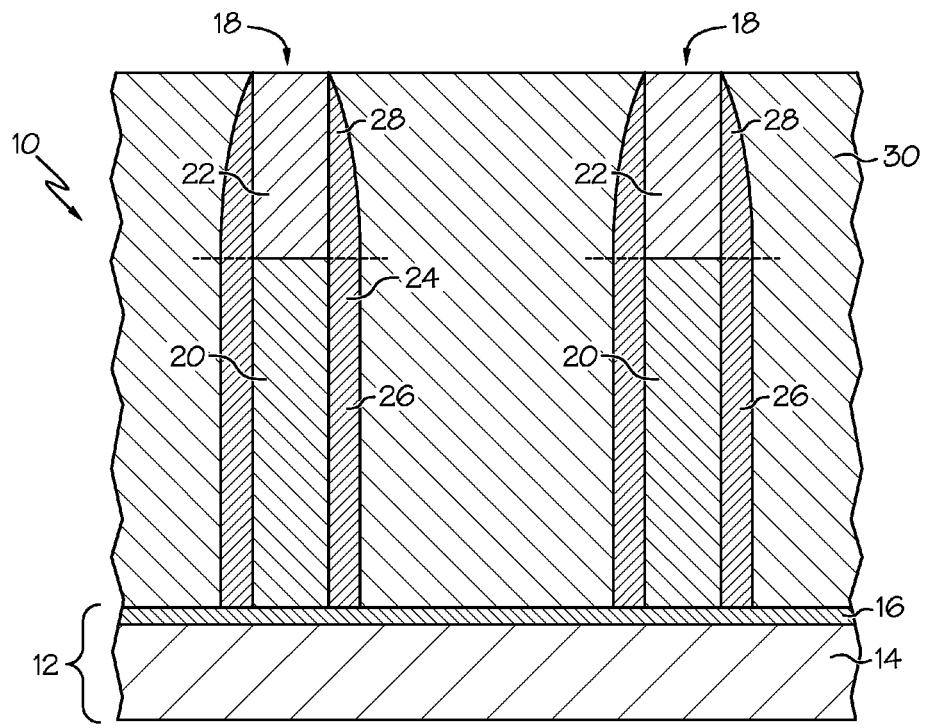
FIG. 3 is a schematic cross-sectional side view of a first dielectric layer formed over the base substrate, sacrificial mandrels, and sidewall spacers of FIG. 2 in accordance with an embodiment.

After forming the sidewall spacers 24, a first dielectric layer 30 is formed overlying the base substrate 12, with the first dielectric layer 30 conformal to at least a portion of the upper portion 28 of the sidewall spacers 24 as illustrated in FIG. 3. In particular, the first dielectric layer 30 is formed over the base substrate 12 to a height that at least overlaps the upper portion 28 of the sidewall spacers 24, with the first dielectric layer 30 conformal to a portion of the sloped outer surface of the upper portion 28. Referring to FIG. 3, in this embodiment, the first dielectric layer 30 is formed directly over the sacrificial dielectric layer 16. In an embodiment, the first dielectric layer 30 is formed from dielectric material that exhibits stress generation upon annealing. For example, the first dielectric layer 30 may be formed from dielectric material chosen from a flowable oxide or spin-on glass. Plowable oxides and spin-on glass are known in the art, and one specific example of a flowable oxide is hydrogen silsesquioxane-based oxide ("HSQ"). The first dielectric layer 30 may be formed by spin-on depositing the dielectric material in liquid form, followed by reheating to facilitate flow of the dielectric material and to form the first dielectric layer 30. The first dielectric layer 30 may then be planarized, for example by CMP, to expose an upper surface of the second region 22 of the sacrificial mandrel 18.

Figure 4:
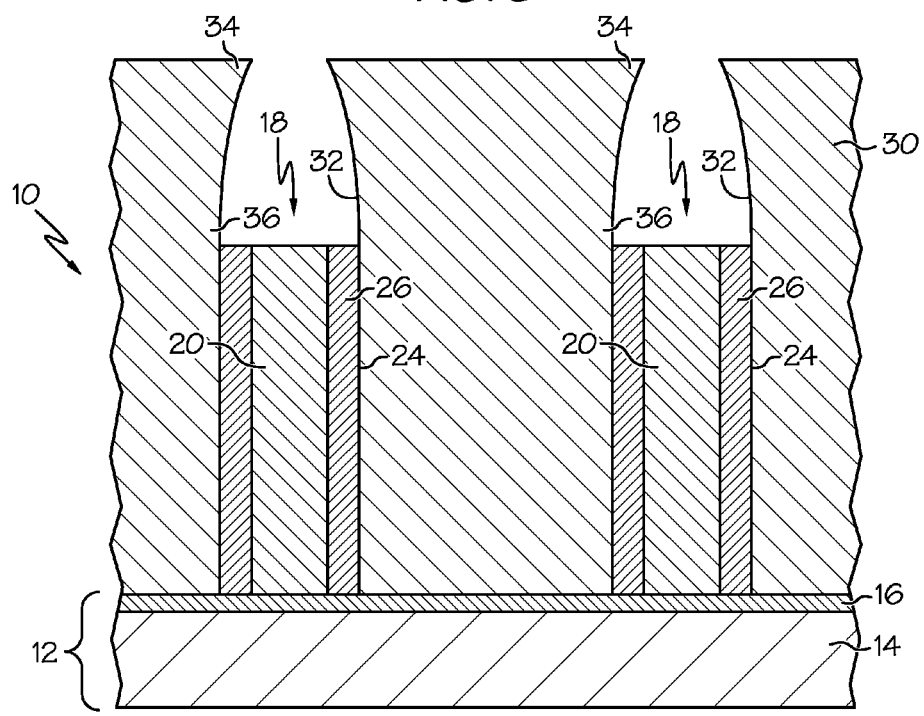
FIG. 4 is a schematic cross-sectional side view of an upper portion of the sidewall spacers and a second region of the sacrificial mandrels of FIG. 3 removed to form recesses having a re-entrant profile.

The upper portion 28 of the sidewall spacers 24 and the second region 22 of the sacrificial mandrel 18 are removed after forming the first dielectric layer 30 to form a recess 32 in the first dielectric layer 30. In particular, the upper portion 28 of the sidewall spacers 24 is removed with an appropriate etching technique, and the second region 22 of the sacrificial mandrel 18 is also removed along with the upper portion 28 of the sidewall spacers 24 to form the recess 32. The entire upper portion 28 is generally removed along with the entire second region 22, and appropriate etching techniques are generally employed that exhibit selectivity toward etching the second region 22 of the sacrificial mandrel 18 to facilitate removal of the upper portion 28 of the sidewall spacers 24 and the second region 22 of the sacrificial mandrel 18. Etching techniques as described above may be employed based upon the composition of the second region 22 of the sacrificial mandrel 18 and sidewall spacers 24, such as RIE using chemistries based upon carbon trifluoride/oxygen ($CHF_3/O_2$) when the sidewall spacers 24 and second region 22 includes silicon nitride. Referring to FIG. 4, due to the sloped outer surface of the upper portion 28 of the sidewall spacers 24, the recess 32 has a re-entrant profile corresponding to the sloped outer surface of the upper portion 28 of the sidewall spacers 24. Due to formation of the recess 32, the first dielectric layer 30 has a free region 34 that is spaced from the lower portion 26 of the sidewall spacers 24 and a pinned region 36 that is adjacent the lower portion 26 of the sidewall spacers 24. The free region 34 refers to a side of the first dielectric layer 30 through which the recess 32 is formed and, optionally, any layers that may overly the first dielectric layer 30. The pinned region 36 refers to a side of the first dielectric layer 30 that overlies one or more continuous layers of the base substrate 12.

Figure 5:
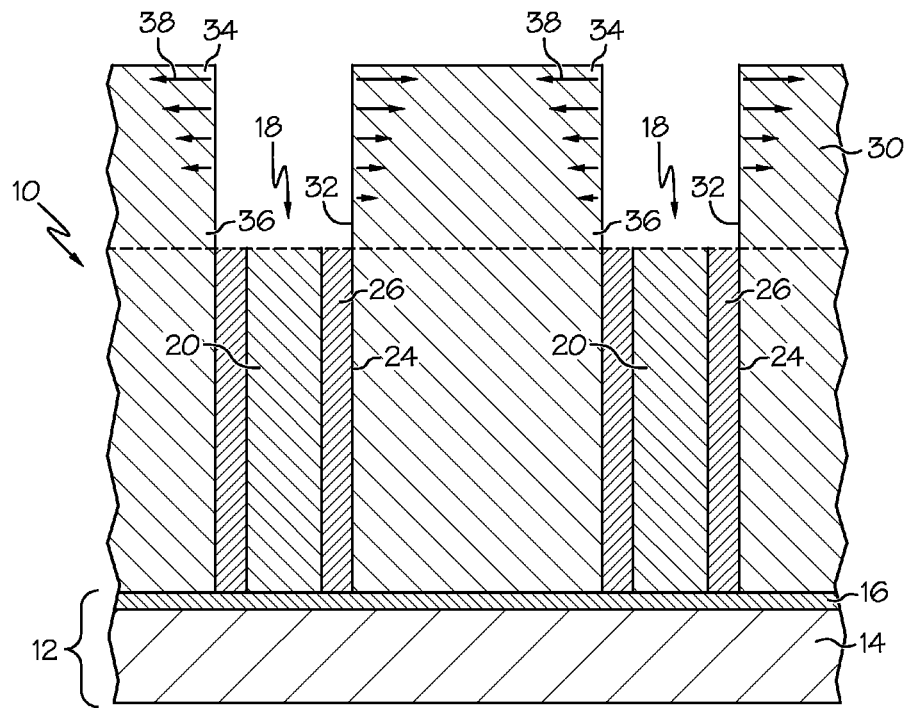
FIG. 5 is a schematic cross-sectional side view of straightening of the re-entrant profile of the recesses of FIG. 4 in accordance with an embodiment.

The re-entrant profile of the recess 32 is straightened in accordance with the instant method. As set forth above, straightening the re-entrant profile involves manipulating the first dielectric layer 30 that defines the re-entrant profile of the recess 32. Straightening the re-entrant profile of the recess 32 can be conducted in various ways and through various mechanisms. For example, in an embodiment and as shown in FIG. 5, stress is generated in the first dielectric layer 30, with the stress expanding the recess 32 adjacent the free region 34 of the first dielectric layer 30 at a greater magnitude than adjacent the pinned region 36 (as schematically represented by the force arrows 38 in FIG. 5). In this embodiment, the stress is further defined as compressive stress, and the compressive stress is generated in the first dielectric layer 30 after removing the upper portion 28 of the sidewall spacers 24. Due to generation of the compressive stress, the free region 34 of the first dielectric layer 30 contracts at a greater magnitude than the pinned region 36 of the first dielectric layer 30 and results in straightening of the re-entrant profile of the recess 32.

As set forth above, the first dielectric layer 30 may be formed from dielectric material that exhibits stress generation upon annealing, and annealing may be conducted to generate the compressive stress in the first dielectric layer 30. When flowable oxides or spin-on glass are used, annealing temperatures of at least 500° C., such as from about 500 to about 1000° C., can be employed to effectively anneal the flowable oxides or spin-on glass. Annealing can be conducted for a period of at least 30 minutes, such as from about 30 to about 180 minutes. Alternatively, although not shown, an overlying compression layer may be formed over the first dielectric layer 30 from a material that is in tension and that compressively stresses the first dielectric layer 30.

A magnitude of shrinkage of the first dielectric layer 30 can be adjusted based upon the annealing times and temperatures, and shrinkage can be controlled to effect strain within the first dielectric layer 30 that is sufficient to straighten the re-entrant profile of the recess 32. For example, in an embodiment, shrinkage of from about 5 to about 10%, corresponding to strain of from about 2 to about 4 nm over 40 nm length scale of the first dielectric layer 30, is sought to effectively straight the re-entrant profile. Annealing of flowable oxides or spin-on glass within the above temperature and time ranges is capable of effecting shrinkage and strain within the first dielectric layer 30 within the above ranges.

Figure 6:
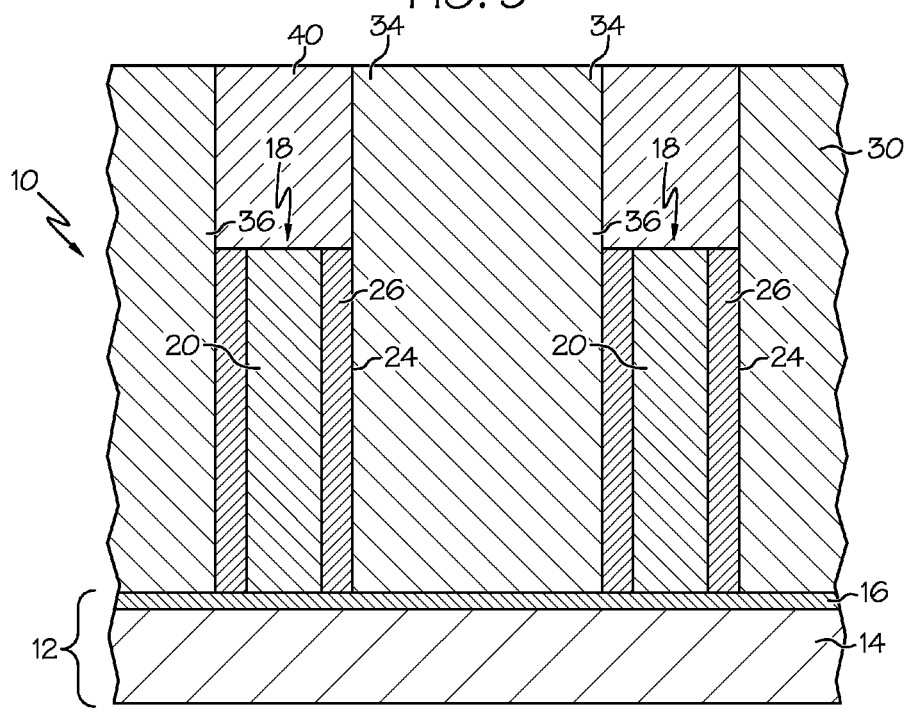
FIG. 6 is a schematic cross-sectional side view of silicon nitride deposits formed in the straightened recesses of FIG. 5.
Figure 7:
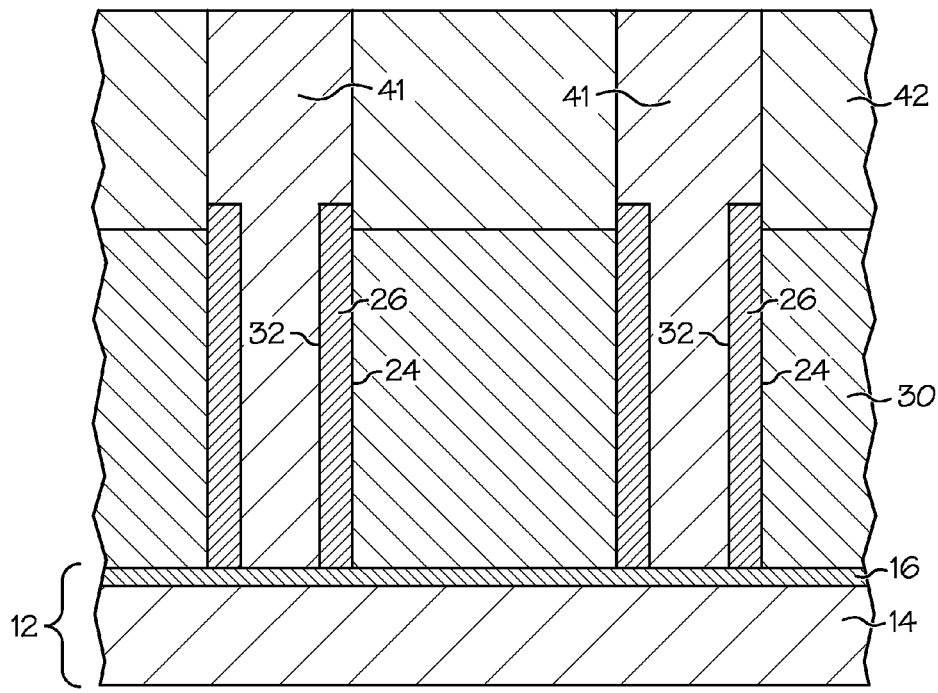
FIG. 7 is a schematic cross-sectional side view of FIG. 6 after recessing the first dielectric layer, HDP oxide layer formation, removal of the silicon nitride deposits and first region of the sacrificial mandrel, and subsequent filling of the recess with electrically-conductive material.

After removing the upper portion 28 of the sidewall spacers 24, and after straightening the re-entrant profile of the recess 32, the first region 20 of the sacrificial mandrel 18 is removed with the lower portion 26 of the sidewall spacers 24 remaining in place. Conventional techniques may be employed to remove the first region 20 of the sacrificial mandrel 18. In an embodiment, prior to removing the first region 20 of the sacrificial mandrel 18, the first dielectric layer 30 may be recessed and a high density plasma (HDP) oxide layer 42 may be formed on the recessed first dielectric layer 30, which is generally resistant to etching techniques that are employed to remove the first region 20 of the sacrificial mandrel 18. In this embodiment, a silicon nitride hard mask may first be deposited over the first dielectric layer 30 and in the recess 32 followed by chemical mechanical planarization to form a silicon nitride deposit 40 in the recess 32, as shown in FIG. 6. Next, the first dielectric layer 30 is recessed with an appropriate etchant for flowable oxide or spin-on glass, followed by formation of the HDP oxide layer 42. Once the HDP oxide layer 42 is formed, the silicon nitride deposit 40 is removed. The first region 20 of the sacrificial mandrel 18 is then selectively removed by etching, as shown in FIG. 7, to extend the recess 32. In the case wherein the first region 20 includes a silicon oxide and sidewall spacers 24 include a silicon nitride, a suitable $HF/H_2O$ solution may be used to selectively remove the first region 20. If these materials are reversed, a heated $H_3PO_4/H_2O$ solution may be used. Alternatively, when the sidewall spacers 24 include either a silicon nitride or a silicon oxide, and the first region 20 includes a-C, a dry, $O_2$-based ashing process may be used to selectively remove the first region 20.

Once the first region 20 of the sacrificial mandrel 18 is removed, conventional techniques may be employed for further techniques that benefit from the presence of the sidewall spacers 24. For example, in an embodiment, electrically-conductive material 41 may be deposited in the recess 32 as shown in FIG. 7. Depending upon a particular level in the integrated circuit 10 in which the recess 32 is formed, the electrically-conductive material 41 can be a replacement metal gate that directly contacts the semiconductor layer 14 or an electrical interconnect that provides an electrical connection between levels of dielectric layers in an integrated circuit. Alternatively, although not shown in FIG. 7, the lower portion 26 of the sidewall spacers 24 may be employed as an etch mask for further etching the base substrate 12. For example, the sacrificial oxide layer 16 can be etched. Under conditions in which a self-aligned contact is to be formed, electrically-conductive material 41 may then be deposited in the recess 32. Alternatively, under conditions in which a replacement gate is to be formed, a gate insulation layer (not shown) may be formed after etching the sacrificial oxide layer 16, followed by depositing electrically-conductive material 41 in the recess 32.

Figure 8:
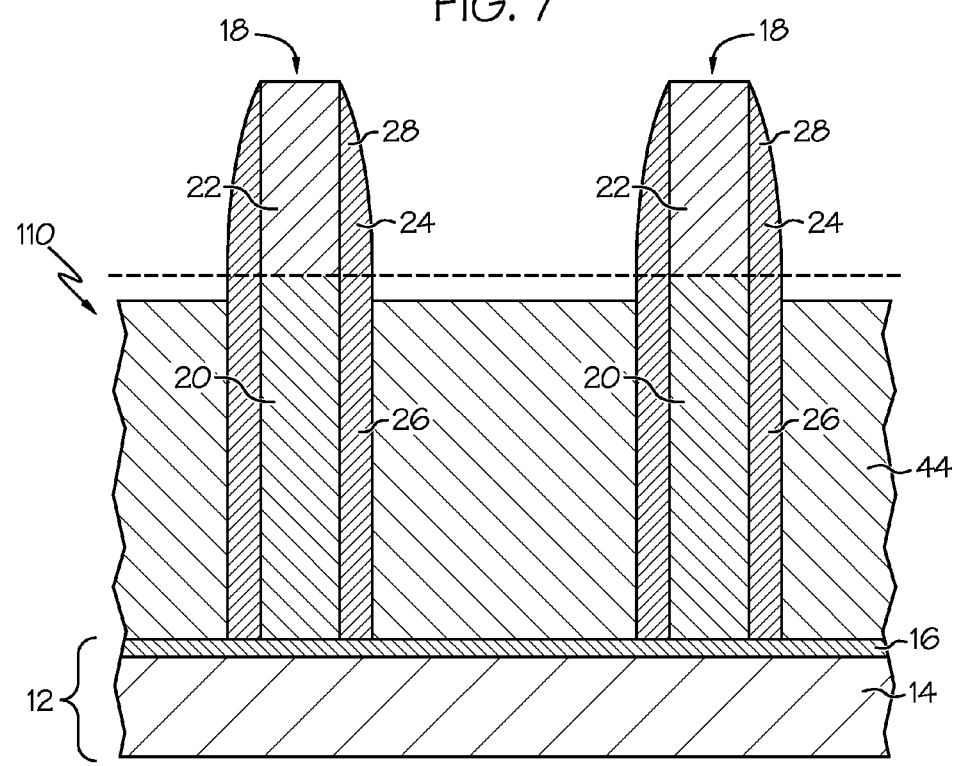
FIG. 8 is a schematic cross-sectional side view of a sacrificial mandrel formed on a base substrate with an underlying dielectric layer formed over the base substrate in accordance with another embodiment.

Another exemplary embodiment of a method of forming an integrated circuit 110 will now be addressed with reference to FIGS. 8-12. In this embodiment, the base substrate 12 is provided and the sacrificial mandrel 18 and sidewall spacers 24 are formed in the same manner as described above. Additionally, an underlying dielectric layer 44 of flowable oxide or spin-on glass is optionally formed in the same manner as described above for the first dielectric layer 30. However, in this embodiment, the underlying dielectric layer 44 is recessed to a depth that is below the upper region of the sidewall spacers 24, as shown in FIG. 8.

Figure 9:
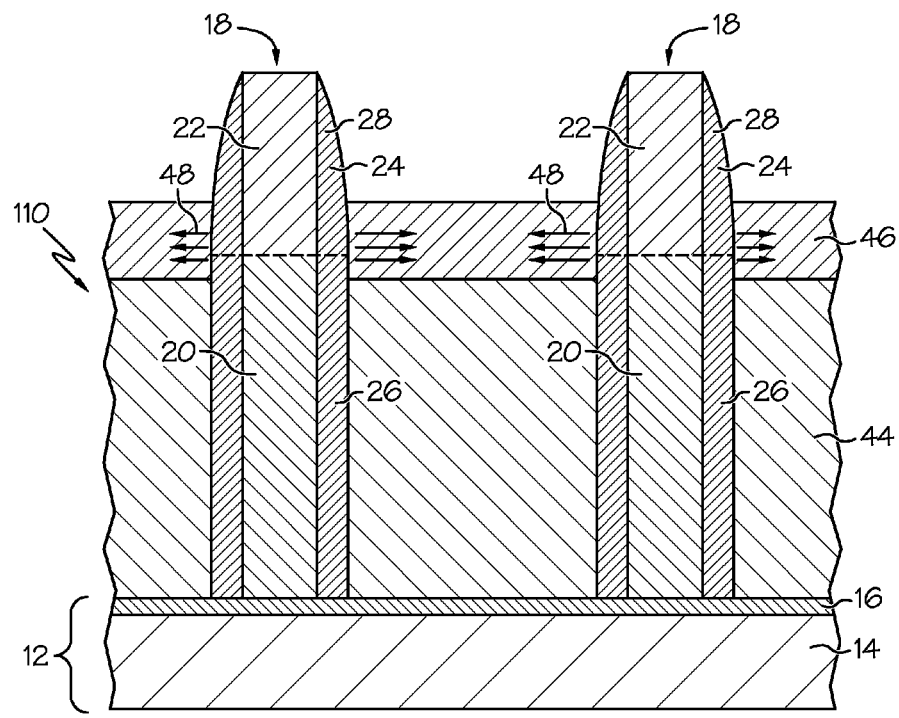
FIG. 9 is a schematic cross-sectional side view of a stress generation layer formed over the underlying dielectric layer of FIG. 8.

Referring to FIG. 9, a stress generation layer 46 is then formed overlying the base substrate 12 and, when present, the underlying dielectric layer 44. The stress generation layer 46 is conformal to at least a portion of the upper portion 28 of the sidewall spacers 24, and subsequent removal of the upper portion 28 of the sidewall spacers 24 releases the stress in adjacent portions of the stress generation layer 46. The stress generation layer 46 is compressively stressed, represented by force arrows 48, and the compressive stress can be introduced into the stress generation layer 46 through various mechanisms, such as by a special CVD film deposition process. As an example, the stress generation layer 46 is formed by depositing silicon nitride over the underlying dielectric layer 44.

Figure 10:
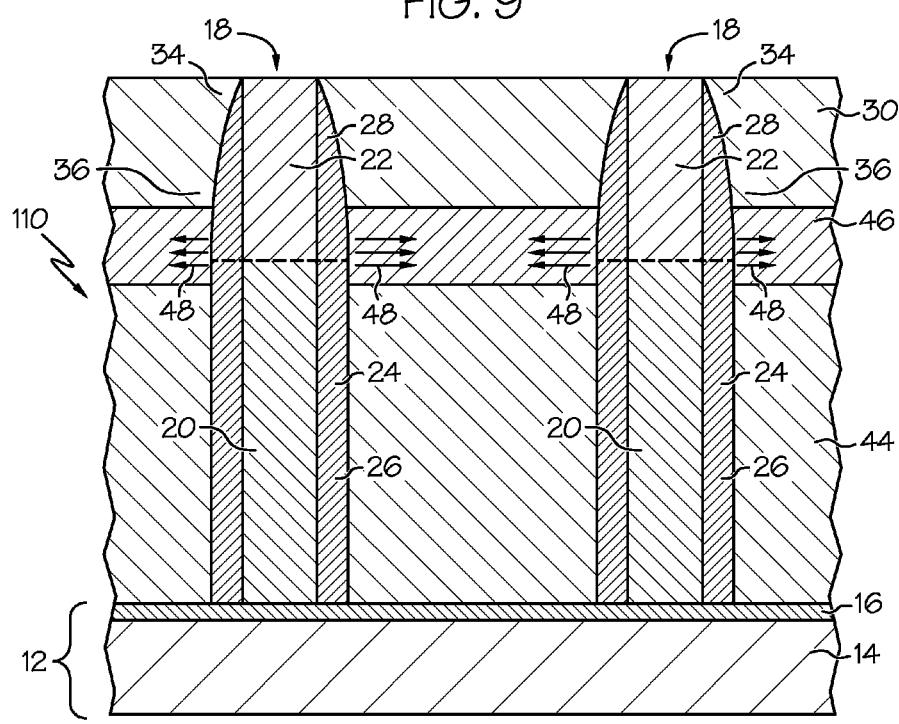
FIG. 10 is a schematic cross-sectional side view of a first dielectric layer formed over the stress generation layer of FIG. 9.
Figure 11:
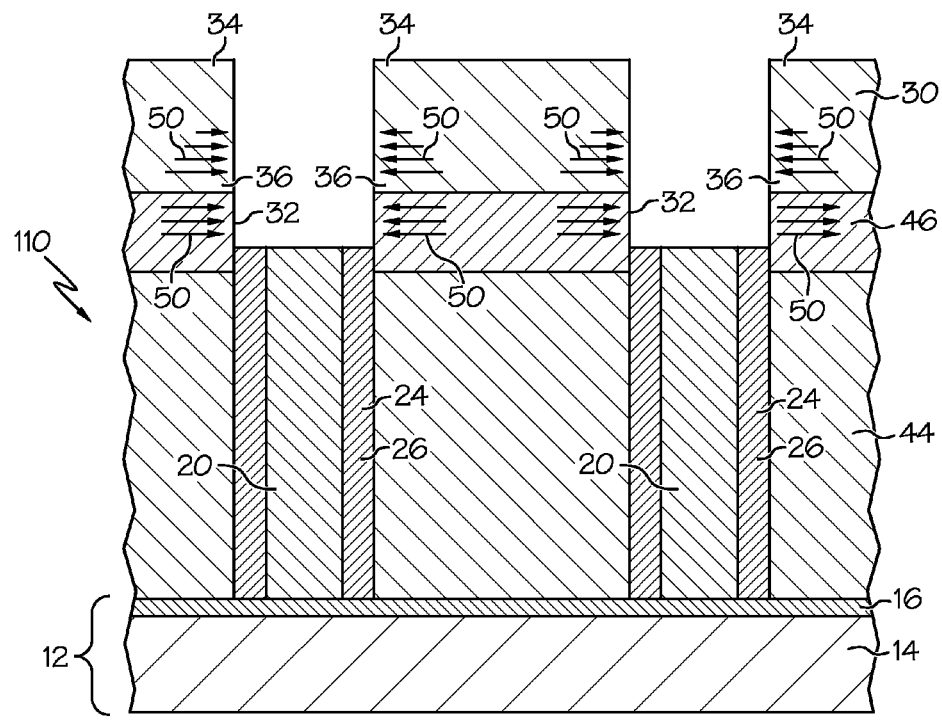
FIG. 11 is a schematic cross-sectional side view of straightening of the re-entrant profile of recesses formed in the first dielectric layer of FIG. 10 after removing an upper portion of the sidewall spacers and a second region of the sacrificial mandrel in accordance with an embodiment.

Referring to FIG. 10, the first dielectric layer 30 is formed overlying the stress generation layer 46 with the first dielectric layer 30 conformal to at least the portion of the upper portion 28 of the sidewall spacers 24. While composition of the first dielectric layer 30 is not particularly limited in this embodiment, the first dielectric layer 30 may be a HDP oxide layer. The first dielectric layer 30 is unstressed prior to removing the upper portion 28 of the sidewall spacers 24, with the stress generation layer 46 still in a compressed state. The upper portion 28 of the sidewall spacers 24 is removed after forming the first dielectric layer 30 to form a recess 32 in the first dielectric layer 30 in the same manner as described above. The recess 32 is also at least partially formed in the stress generation layer 46.

In this embodiment, stress is generated in the first dielectric layer 30 concurrent with removing the upper portion 28 of the sidewall spacers 24. In particular, because the stress generation layer 46 is conformal to at least the portion of the upper portion 28 of the sidewall spacers 24, and because the recess 32 is at least partially formed in the stress generation layer 46, after removing the upper portion 28 of the sidewall spacers 24, stress is released in the stress generation layer 46 concurrent with removing the upper portion 28 of the sidewall spacers 24. Because the stress generation layer 46 is under compressive stress, release of the stress results in expansion of the stress generation layer 46 into the recess 32, as indicated by force arrows 50. Upon expansion of the stress generation layer 46 into the recess 32, the first dielectric layer 30 overlying the stress generation layer 46 becomes tensively stressed. Thus, in this embodiment, the stress that is generated in the first dielectric layer 30 is tensive stress, and the tensive stress is generated in the first dielectric layer 30 concurrent with removing the upper portion 28 of the sidewall spacers 24. Because the pinned region 36 of the first dielectric layer 30 is in closer proximity to the stress generation layer 46 than the free region 34, the pinned region 36 expands at a greater magnitude than the free region 34 of the first dielectric layer 30, thereby resulting in straightening of the re-entrant profile of the recess 32.

Figure 12:
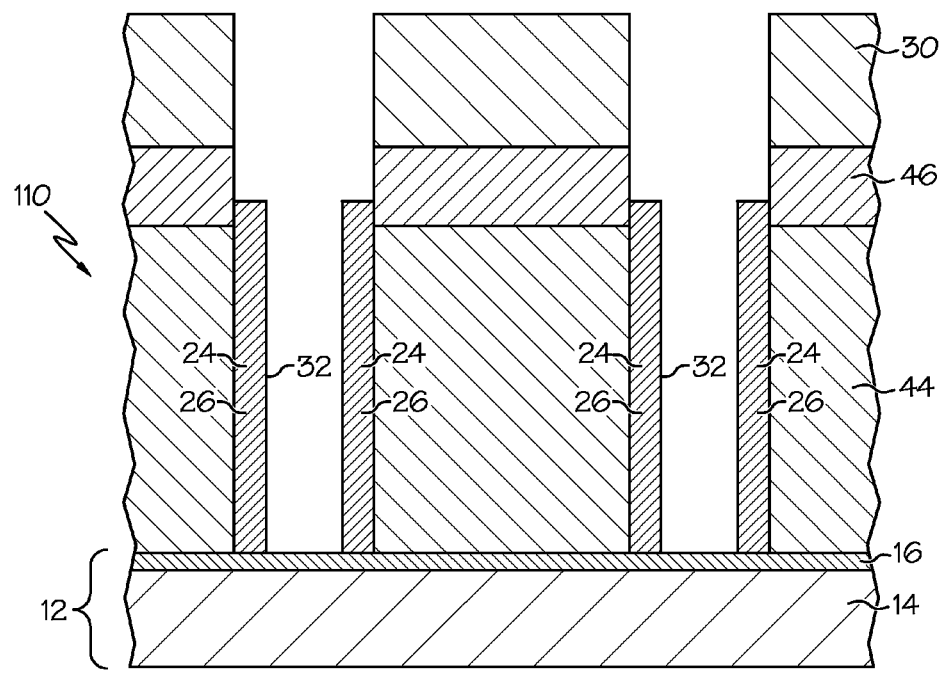
FIG. 12 is a schematic cross-sectional side view of FIG. 11 after removal of a first region of the sacrificial mandrel.

After straightening the re-entrant profile of the recess 32, the first region 20 of the sacrificial mandrel 18 is removed, with the lower portion 26 of the sidewall spacers 24 remaining in place as shown in FIG. 12. Because the first dielectric layer 30 is formed from HDP oxide in this embodiment, the lower portion 26 of the sidewall spacers 24 can be removed immediately following removal of the upper portion 28 of the sidewall spacers 24 and second region 22 of the sacrificial mandrel 18 using the techniques described above.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:
    forming a sacrificial mandrel overlying a base substrate, the sacrificial mandrel having sidewalls;
    forming sidewall spacers adjacent the sidewalls of the sacrificial mandrel, the sidewall spacers having a lower portion proximal the base substrate and having a substantially perpendicular outer surface relative to the base substrate and an upper portion spaced from the base substrate and having a sloped outer surface;
    forming a first dielectric layer overlying the base substrate and conformal to at least a portion of the upper portion of the sidewall spacers;
    removing the upper portion of the sidewall spacers after forming the first dielectric layer to form a recess in the first dielectric layer, the recess having a re-entrant profile corresponding to the sloped outer surface of the upper portion of the sidewall spacers; and
    straightening the re-entrant profile of the recess wherein forming the recess produces the first dielectric layer having a free region spaced from the lower portion of the sidewall spacers and a pinned region adjacent the lower portion of the sidewall spacers, wherein straightening the re-entrant profile comprises generating stress in the first dielectric layer that expands the recess adjacent the free region of the first dielectric layer at a greater magnitude than adjacent the pinned region.

2. The method of claim 1, wherein the stress is generated in the first dielectric layer after removing the upper portion of the sidewall spacers.

3. The method of claim 2, wherein the stress is further defined as compressive stress and wherein the compressive stress is generated in the first dielectric layer after removing the upper portion of the sidewall spacers.

4. The method of claim 3, wherein generating the compressive stress in the first dielectric layer comprises annealing the first dielectric layer.

5. The method of claim 4, wherein generating the compressive stress comprises contracting the free region of the first dielectric layer at a greater magnitude than the pinned region of the first dielectric layer.

6. The method of claim 4, wherein the first dielectric layer is formed from dielectric material chosen from a flowable oxide or spin-on glass.

7. The method of claim 1, wherein generating stress in the first dielectric layer comprises expanding the pinned region of the first dielectric layer at a greater magnitude than the free region of the first dielectric layer.

8. The method of claim 1, wherein the stress is generated in the first dielectric layer concurrent with removing the upper portion of the sidewall spacers.

9. The method of claim 8, wherein the stress is further defined as tensive stress and wherein the tensive stress is generated in the first dielectric layer concurrent with removing the upper portion of the sidewall spacers.

10. The method of claim 9, wherein generating the tensive stress in the first dielectric layer comprises forming a stress generation layer overlying the base substrate and in compressive stress, with the first dielectric layer overlying the stress generation layer.

11. The method of claim 10, wherein the first dielectric layer is unstressed prior to removing the upper portion of the sidewall spacers and wherein removing the upper portion of the sidewall spacers comprises expanding the pinned region of the first dielectric layer at a greater magnitude than the free region of the first dielectric layer.

12. The method of claim 1, wherein the sacrificial mandrel comprises a first region proximal to the base substrate and comprising a first sacrificial material, and a second region spaced from the base substrate adjacent to the upper portion of the sidewall spacers and comprising a second sacrificial material, and wherein removing the upper portion of the sidewall spacers comprises removing the second region of the sacrificial mandrel along with the upper portion of the sidewall spacers to form the recess.

13. The method of claim 12, further comprising removing the first region of the sacrificial mandrel after removing the upper portion of the sidewall spacers, with the lower portion of the sidewall spacers remaining in place.

14. The method of claim 13, further comprising etching the base substrate through the recess using the lower portion of the sidewall spacers as an etch mask.

15. The method of claim 13, further comprising depositing electrically-conductive material in the recess.

16. A method of forming an integrated circuit, the method comprising:
    forming a sacrificial mandrel overlying a base substrate, the sacrificial mandrel having sidewalls;
    forming sidewall spacers adjacent the sidewalls of the sacrificial mandrel, the sidewall spacers having a lower portion proximal the base substrate and having a substantially perpendicular outer surface relative to the base substrate and an upper portion spaced from the base substrate and having a sloped outer surface;
    forming a first dielectric layer overlying the base substrate and conformal to at least a portion of the upper portion of the sidewall spacers;
    removing the upper portion of the sidewall spacers after forming the first dielectric layer to form a recess in the first dielectric layer, the recess having a re-entrant profile corresponding to the sloped outer surface of the upper portion of the sidewall spacers, wherein the first dielectric layer has a free region spaced from the lower portion of the sidewall spacers and a pinned region adjacent the lower portion of the sidewall spacers; and
    generating compressive stress in the first dielectric layer after removing the upper portion to straighten the re-entrant profile of the recess.

17. The method of claim 16, wherein generating compressive stress in the first dielectric layer comprises annealing the first dielectric layer to expand the recess adjacent the free region of the first dielectric layer at a greater magnitude than adjacent the pinned region.

18. A method of forming an integrated circuit, the method comprising:
    forming a sacrificial mandrel overlying a base substrate, the sacrificial mandrel having sidewalls;
    forming sidewall spacers adjacent the sidewalls of the sacrificial mandrel, the sidewall spacers having a lower portion proximal the base substrate and having a substantially perpendicular outer surface relative to the base substrate and an upper portion spaced from the base substrate and having a sloped outer surface;
    forming a stress generation layer overlying the base substrate and in compressive stress;
    forming a first dielectric layer overlying the stress generation layer and the base substrate, the first dielectric layer conformal to at least a portion of the upper portion of the sidewall spacers;
    removing the upper portion of the sidewall spacers after forming the first dielectric layer to form a recess in the first dielectric layer, the recess having a re-entrant profile corresponding to the sloped outer surface of the upper portion of the sidewall spacers, wherein the first dielectric layer has a free region spaced from the lower portion of the sidewall spacers and a pinned region adjacent the lower portion of the sidewall spacers and wherein tensive stress is generated in the first dielectric layer concurrent with removing the upper portion of the sidewall spacers to straighten the re-entrant profile of the recess.

* * * * *